United States Patent [19]

Gohara et al.

[11] Patent Number: 5,453,938
[45] Date of Patent: Sep. 26, 1995

[54] COMPRESSION GENERATION METHOD FOR FONT DATA USED IN PRINTERS

[75] Inventors: Aijiro Gohara; Kazuaki Ikeda; Kenji Ishida, all of Tokyo, Japan

[73] Assignee: Seikosha Co., Ltd., Tokyo, Japan

[21] Appl. No.: 89,863

[22] Filed: Jul. 8, 1993

[30] Foreign Application Priority Data

Jul. 9, 1991 [JP] Japan .................... 3-182120
Jul. 9, 1992 [JP] Japan .................... 4-182121

[51] Int. Cl.⁶ .................................................. H04N 1/419
[52] U.S. Cl. ........................................................ 364/514 R
[58] Field of Search ........................ 364/514, 260.6, 364/259.1, 951.3, 947.1; 395/114, 110; 341/51, 55, 87; 345/202

[56] References Cited

U.S. PATENT DOCUMENTS

| | | | |
|---|---|---|---|
| 3,535,696 | 10/1970 | Webb et al. | 364/260.6 |
| 3,694,813 | 9/1972 | Loh et al. | 364/260.6 |
| 4,481,602 | 11/1984 | Bohrer et al. | 345/202 |
| 4,516,173 | 5/1985 | Abe et al. | 345/202 |
| 4,578,765 | 3/1986 | Barker | 364/514 |
| 4,901,248 | 2/1990 | Veno et al. | 395/110 |
| 5,005,137 | 4/1991 | Ernst | 364/514 |
| 5,046,025 | 9/1991 | Harper et al. | 364/514 |
| 5,179,711 | 1/1993 | Vreeland | 364/260.6 |
| 5,272,768 | 12/1993 | Bauman | 395/114 |
| 5,347,650 | 9/1994 | Arditti et al. | 364/260.6 |

FOREIGN PATENT DOCUMENTS

2538979 7/1984 France .................... 345/202

OTHER PUBLICATIONS

IBM Technical Disclosure Bulletin; "Compression/Decompression of Font Patterns"; vol. 28, No. 8, 1986.

*Primary Examiner*—Ellis B. Ramirez
*Attorney, Agent, or Firm*—Jordan and Hamburg

[57] ABSTRACT

A font pattern to be stored is created by sequentially forming exclusive logical sums neighboring first bit patterns A1–A20 to form a plurality of second neighboring bit patterns B1–B20; designating at least one or more than one bit pattern which appears most frequently in the plurality of second bit patterns as a reference bit pattern, comprising and storing the difference of each bit pattern of the plurality of second bit patterns and the reference bit pattern per each bit pattern, and storing only the bit patterns which differ from the reference bit pattern in the plurality of second bit patterns.

6 Claims, 16 Drawing Sheets

FIG. 2

| | | | |
|---|---|---|---|
| \|Change Point Data (Hexadecimal Data) | | | |
| D1 (01) H | D2 (00) H | D3 (01) H | D4 (80) H |
| D5 (01) H | D6 (80) H | D7 (01) H | D8 (80) H |
| D9 (FF) H | D10 (FF) H | D11 (FF) H | D12 (FF) H |
| D13 (FF) H | D14 (FF) H | D15 (FF) H | D16 (FF) H |
| D17 (01) H | D18 (80) H | D19 (01) H | D20 (80) H |

FIG.3

| Reference Bit Pattern Data | (FF) H |
|---|---|

| Compression Map Table (bit data) |||||||| 
|---|---|---|---|---|---|---|---|
| 1 | 1 | 1 | 1 | 1 | 1 | 1 | 1 |
| 0 | 0 | 0 | 0 | 0 | 0 | 0 | 0 |
| 1 | 1 | 1 | 1 | | | | |

| Number of Pattern Data | (14) H |
|---|---|

| Compression Bit Pattern Data ||||
|---|---|---|---|
| (01) H | (00) H | (01) H | (80) H |
| (01) H | (80) H | (01) H | (80) H |
| (01) H | (80) H | (01) H | (80) H |

FIG.6

| Reference Bit Pattern Data 1 | (FF) H |
|---|---|
| Reference Bit Pattern Data 2 | (01) H |
| Reference Bit Pattern Data 3 | (80) H |

| Compression Map Table (bit data) ||||
|---|---|---|---|
| 0 1 | 1 1 | 0 1 | 1 0 |
| 0 1 | 1 0 | 0 1 | 1 0 |
| 0 0 | 0 0 | 0 0 | 0 0 |
| 0 0 | 0 0 | 0 0 | 0 0 |
| 0 1 | 1 0 | 0 1 | 1 0 |

| Number of Pattern Data | (14) H |
|---|---|
| Compression Bit Pattern Data | (00) H |

FIG. 10

| | | | |
|---|---|---|---|
| | Change Point Data (Hexadecimal Data) | | |
| D1 (01)H | D2 (00)H | D3 (00)H | D4 (80)H |
| D5 (00)H | D6 (00)H | D7 (00)H | D8 (00)H |
| D9 (FE)H | D10 (7F)H | D11 (00)H | D12 (00)H |
| D13 (00)H | D14 (00)H | D15 (00)H | D16 (00)H |
| D17 (FE)H | D18 (7F)H | D19 (00)H | D20 (00)H |

| Reference Bit Pattern Data | (0 0) H |
|---|---|

| Compression Map Table (bit data) |||||||||
|---|---|---|---|---|---|---|---|
| 1 | 0 | 0 | 1 | 0 | 0 | 0 | 0 |
| 1 | 1 | 0 | 0 | 0 | 0 | 0 | 0 |
| 1 | 1 | 0 | 0 | | | | |

| Number of Pattern Data | (1 4) H |
|---|---|

| Compression Bit Pattern Data ||||
|---|---|---|---|
| (0 1) H | (8 0) H | (F E) H | (7 F) H |
| (F E) H | (7 F) H | | |

| Reference Bit Pattern Data 1 | (0 0) H |
|---|---|
| Reference Bit Pattern Data 2 | (F E) H |
| Reference Bit Pattern Data 3 | (7 F) H |

| Compression Map Table (bit data) ||||
|---|---|---|---|
| 1 1 | 0 0 | 0 0 | 1 1 |
| 0 0 | 0 0 | 0 0 | 0 0 |
| 0 1 | 1 0 | 0 0 | 0 0 |
| 0 0 | 0 0 | 0 0 | 0 0 |
| 0 1 | 1 0 | 0 0 | 0 0 |

| Number of Pattern Data | (1 4) H |
|---|---|
| Compression Bit Pattern Data | (0 1) H |
| | (8 0) H |

5,453,938

COMPRESSION GENERATION METHOD FOR FONT DATA USED IN PRINTERS

FIELD OF THE INVENTION

The present invention relates to a method for creating font data in a printer or the like.

BACKGROUND OF THE INVENTION

When font data of a printer or the like is to be stored, occasionally a font pattern is stored in compressed form in order to reduce the required memory, although bit map data of a font is stored as it is in some cases. In the past, however, sometimes a font pattern could not be effectively compressed.

SUMMARY OF THE INVENTION

Accordingly, it is an object of the invention to provide a method for creating font data which allows the effective compression of a font pattern.

BRIEF DESCRIPTION OF THE DRAWINGS

FIGS. 1(A) and 1(B) are drawings related to first and second embodiments of the present invention, wherein FIG. 1(A) is an explanatory drawing showing an original font pattern and FIG. 1(B) is an explanatory drawing showing the font pattern after translation;

FIG. 2 is an explanatory drawing showing hexadecimal data which corresponds to the font pattern after translation in FIG. 1(B);

FIG. 3 is a table showing each data created and stored based on the font pattern after translation according to the first embodiment of the invention;

FIG. 6 is a table showing each data created and stored based on the font pattern after translation according to the second embodiment of the invention;

FIGS. 9(A)–9(C) are drawings related to third and fourth embodiments of the present invention, wherein FIG. 9(A) is an explanatory drawing showing an original font pattern, FIG. 9(B) is an explanatory drawing showing the font pattern during processing, and FIG. 9(C) is an explanatory drawing showing the font pattern after translation;

FIG. 10 is an explanatory drawing showing hexadecimal data which corresponds to the font pattern after translation in FIG. 9(B);

FIG. 11 is a table showing each data created and stored based on the font pattern after translation according to the third embodiment of the invention;

FIG. 14 is a table showing each data created and stored based on the font pattern after translation according to the fourth embodiment of the invention;

DESCRIPTION OF THE PREFERRED EMBODIMENTS

A first embodiment of the present invention will now be explained with reference to FIGS. 1, 2, 3, 4, and 5.

Figure 4:
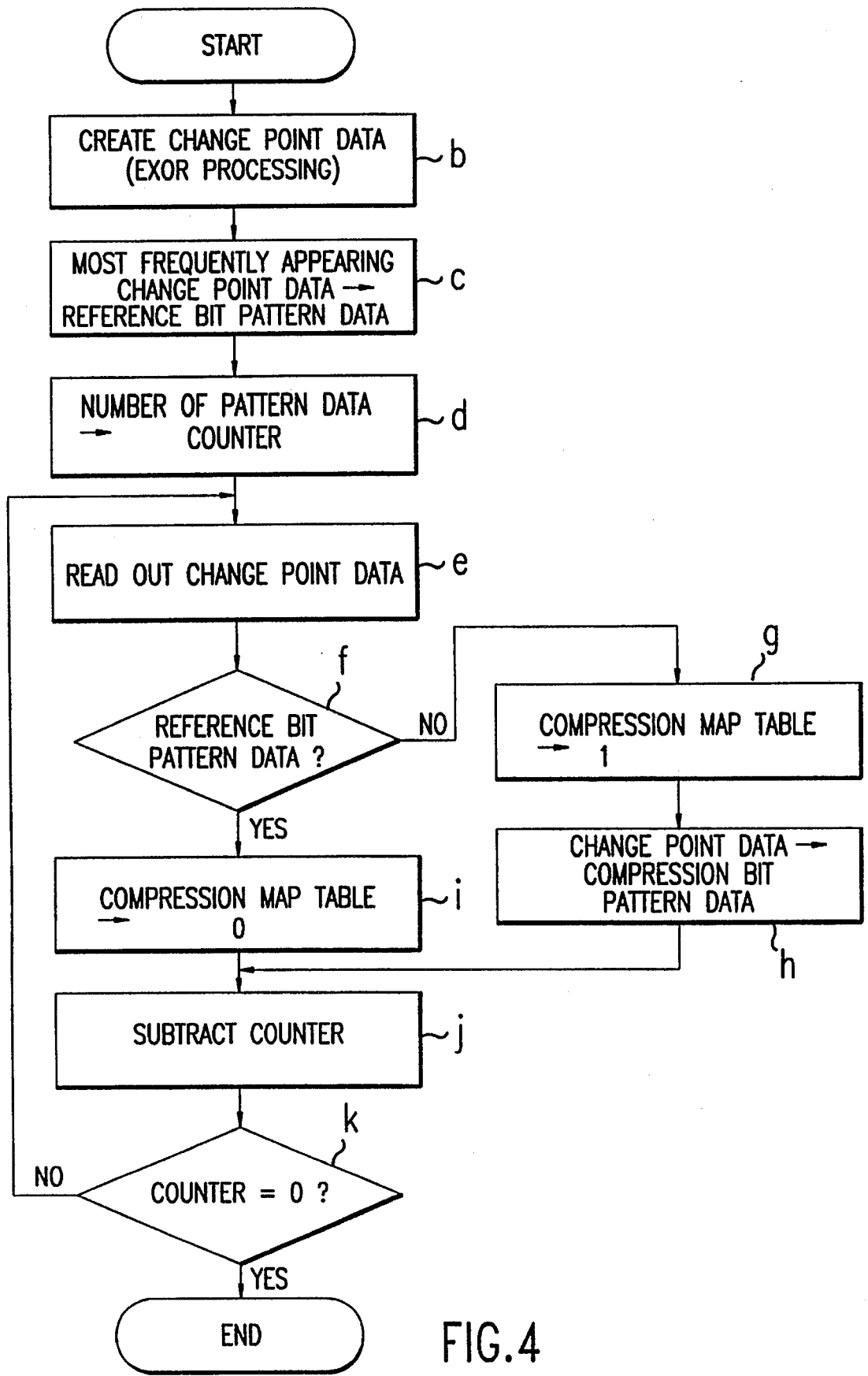
FIG. 4 is a flow chart showing a data compressing operation according to the first embodiment of the invention.
Figure 5:
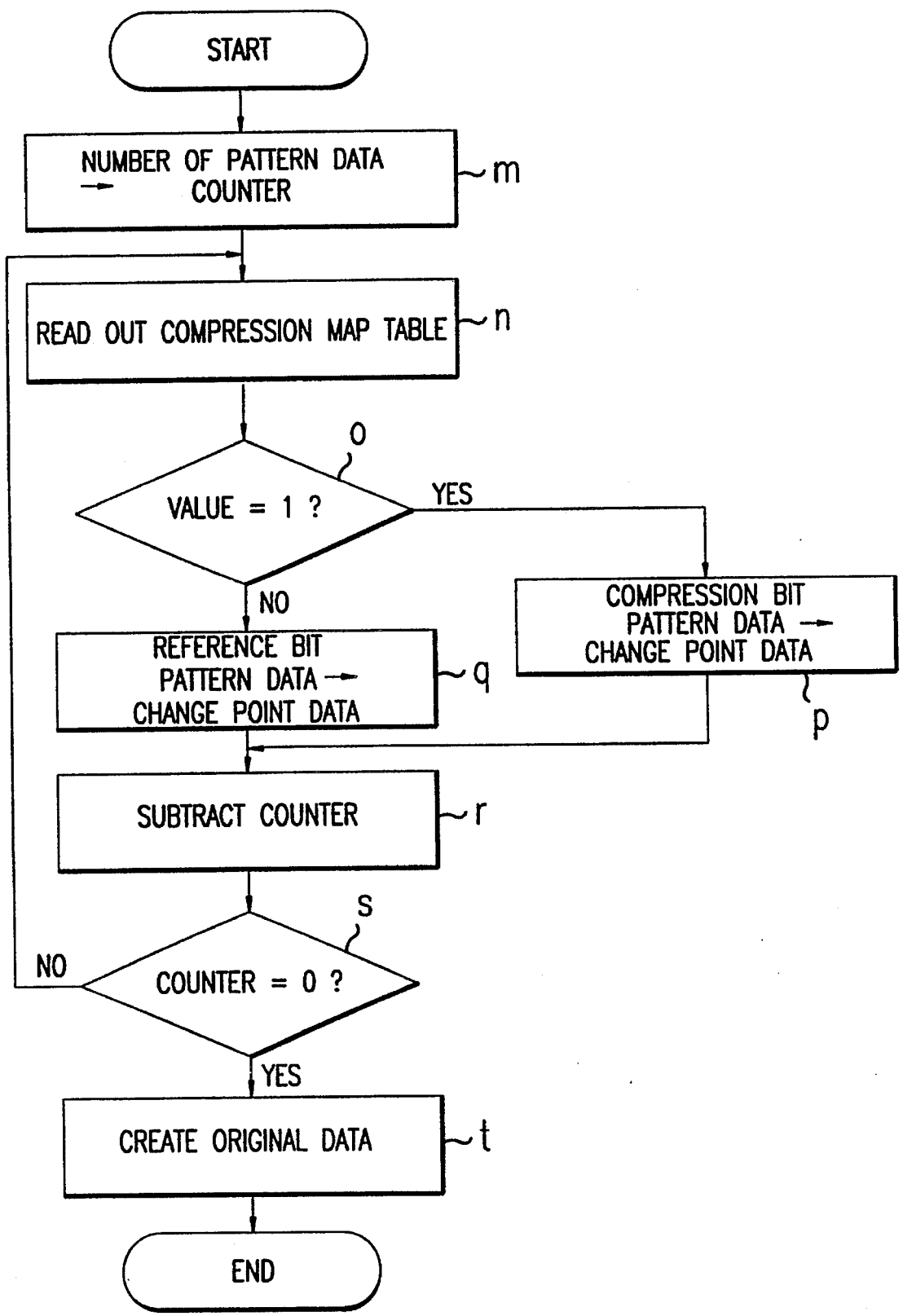
FIG. 5 is a flow chart showing a data reproducing operation according to the first embodiment of the invention.

FIG. 1(A) is an explanatory drawing showing an original font pattern and FIG. 1(B) is an explanatory drawing showing the font pattern after translation, FIG. 2 is an explanatory drawing showing hexadecimal data which corresponds to the font pattern after translation in FIG. 1(B), FIG. 3 is a table showing each data created and stored based on the font pattern after translation, FIG. 4 is a flow chart showing a data compressing operation, and FIG. 5 is a flow chart showing a data reproducing operation.

Following to the flow chart in FIG. 4, the data compressing operation according to the first embodiment will be explained.

FIG. 1(A) shows an original font pattern for one font and the original font pattern is divided into first bit patterns A1–A20 each of which is illustrated as being comprised of a column of 8 bits. Second bit patterns B1–B20 shown in FIG. 1(B) in a similar manner are created by implementing exclusive OR (EXOR) processing sequentially to those first bit patterns A1–A20. Specifically, the following processing is carried out.

```
A1 ... B1
A2 ... B2
A1 (EXOR) A3 ... B3
A2 (EXOR) A4 ... B4
.
.
.
A17 (EXOR) A19 ... B19
A18 (EXOR) A20 ... B20
```

These second bit patterns B1–B20 are represented in hexadecimal form as change point data D1–D20 shown in FIG. 2. These change point data D1–D20 are stored once in a buffer. The subscript "H" denotes hexadecimal data (step b).

Data "(FF)H" which appears most frequently in the change point D1–D20 in FIG. 2 is stored as reference bit pattern data in FIG. 3 (step c). The number of the second bit patterns B1–B20, i.e., the number of change points D1–D20 "(14)H" is set in a counter as a number of pattern data in FIG. 3 (step d).

The change point data D1–D20 is sequentially read from the buffer (step e). The change point data Dn read is compared with the reference bit pattern data "(FF)H" (step f). When the two data are not equal, bit data "1" is stored in the compression map table in FIG. 3 (step g). At the same time, the change point data Dn is stored as compression bit pattern data (step h). When the two data are equal, bit data "0" is stored in the compression map table in FIG. 3 (step i).

"1" is subtracted from the value of the counter (step j). The above operation steps e–j are repeated until the value of the counter becomes "0" (step k). Thus, while the difference and equality of the change point data Dn and the bit pattern data "(FF)H" are stored sequentially in the compression map table, the change point data Dn is stored sequentially as a compression bit pattern data only when the two data differ.

Next, the data reproducing operation in the first embodiment will be explained following the flow chart shown in FIG. 5.

The pattern data number "(14)H" in FIG. 3 is set in the counter (step m). The bit data is read separately sequentially from the top from the compression map table in FIG. 3 (step n). It is compared whether the bit data is "1" or not (step o). When the bit data is "1" one of compression bit pattern data in FIG. 3 is read sequentially from the top and is reproduced as the change point data in FIG. 2 (step p). When the bit data is not "1" the reference bit pattern data "(FF)H" is reproduced as the change point data in FIG. 2 (step q).

Figure 1:
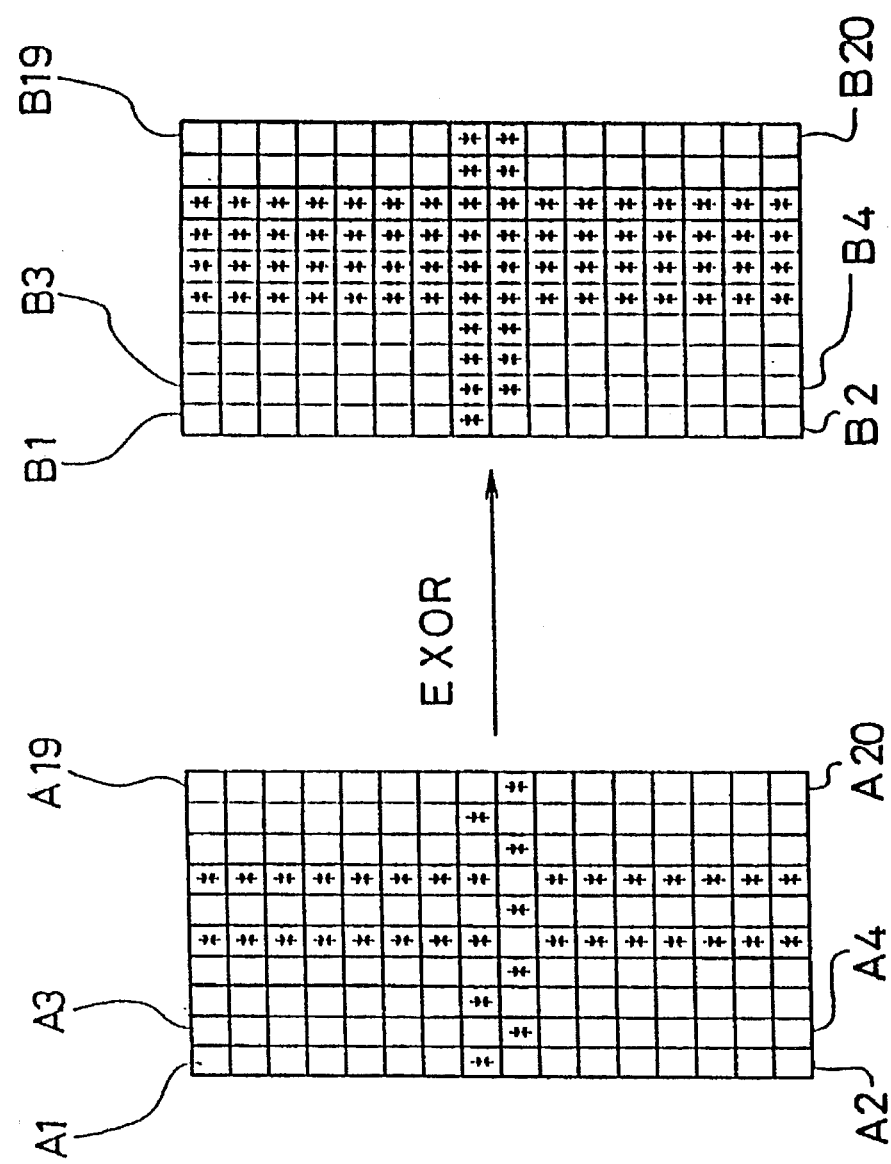

"1" is subtracted from the value of the counter (step r). The above operations n–r are repeated sequentially until the value of the counter becomes "0" (step s). Thus the change point data D1–D20 in FIG. 2, i.e., the second bit patterns B1–B20 in FIG. 1 are reproduced. The first bit patterns A1–A20 in FIG. 1(A) are reproduced from the second bit patterns B1–B20 in FIG. 1(B) to reproduce the original font pattern (step t).

The second embodiment of the invention will now be explained with reference to FIGS. 1, 2, 6, 7 and 8.

Figure 7:
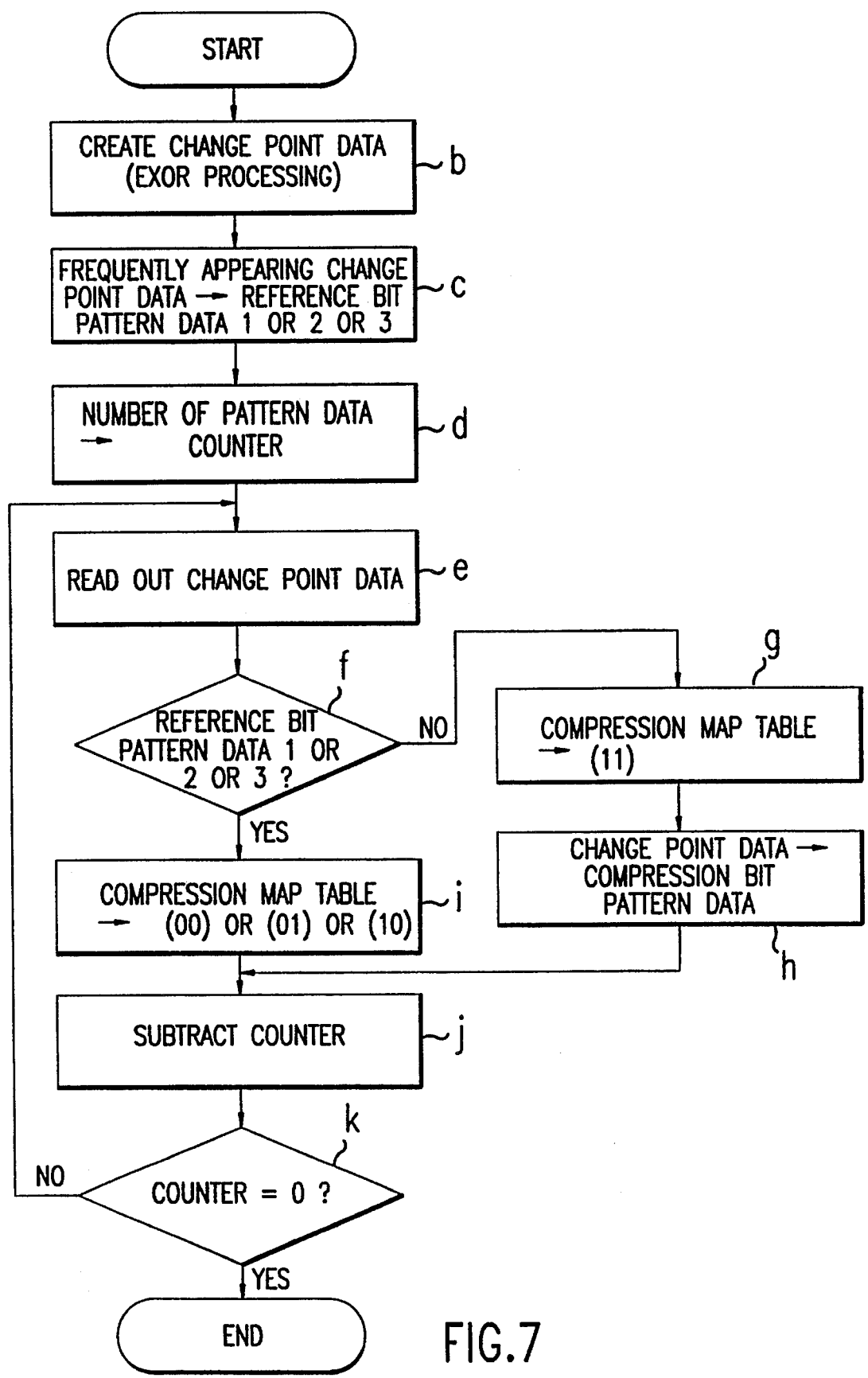
FIG. 7 is a flow chart showing data compressing operation according to the second embodiment of the invention.
Figure 8:
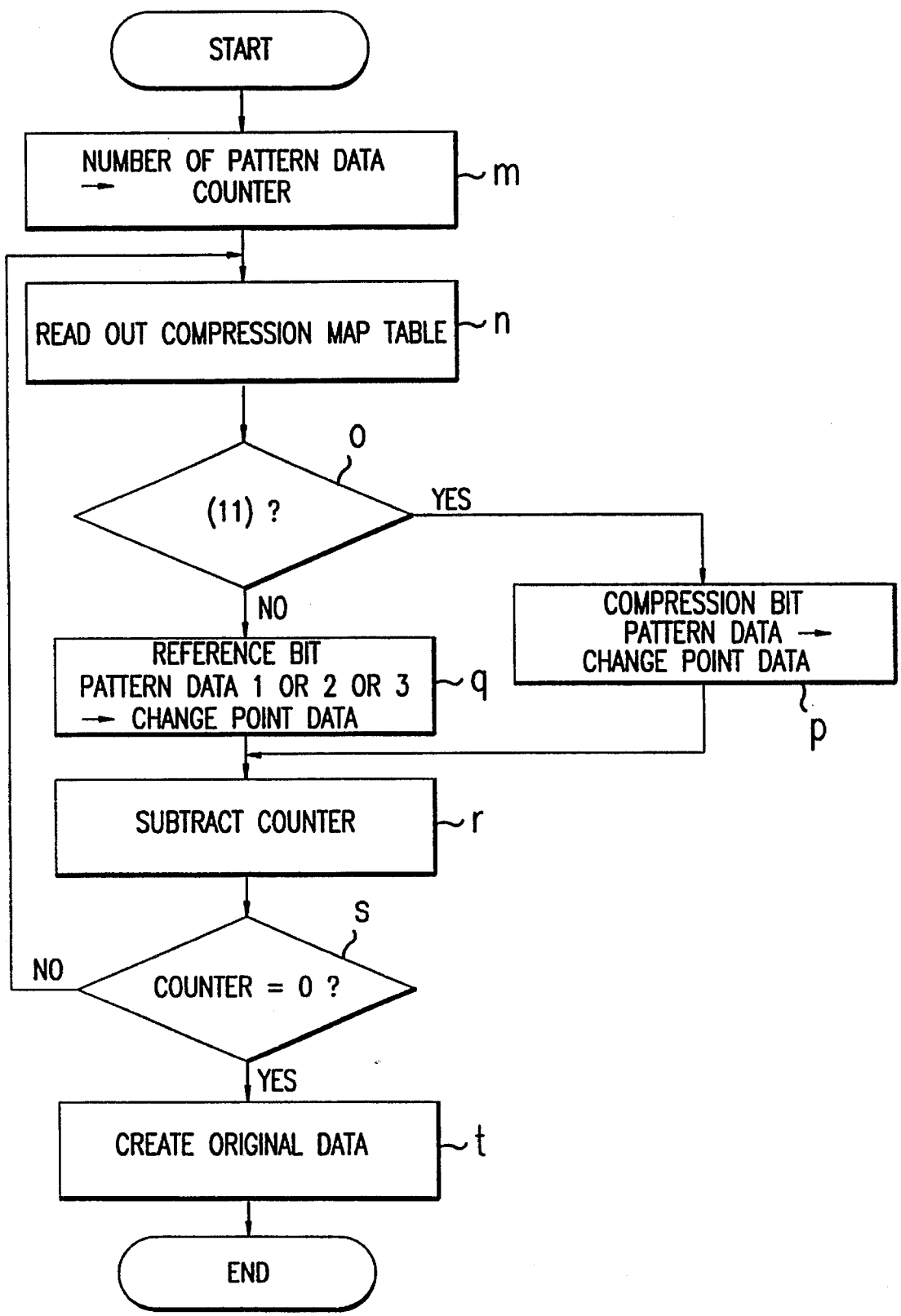
FIG. 8 is a flow chart showing data reproducing.

FIGS. 1 and 2 are the same as those in the first embodiment and FIGS. 6, 7, and 8 correspond respectively to FIGS. 3, 4 and 5 of the first embodiment. Accordingly, the part of explanation which overlaps with that of the first embodiment will be omitted hereinafter.

The data compressing operation in the second embodiment will be explained with reference to the flow chart of FIG. 7.

The second bit pattern B1–B20 in FIG. 1(B) are created by implementing EXOR processing on the first bit patterns A1–A20 in FIG. 1(A) in the same manner as in the first embodiment and the change point data D1–D20 are stored in the buffer (step b).

Three data which appear more frequently among the change point data D1–D20 in FIG. 2, i.e., "(FF)H", "(01)H" and "(80)H" are selected and are stored respectively as reference bit pattern data 1, reference bit pattern data 2 and reference bit pattern data 3 in FIG. 6 (step c). The number of the second bit patterns B1–B20, i.e., the number of change point data D1–D20 "(14)H" is set in a counter as a number of pattern data in FIG. 6 (step d).

The change point data D1–D20 is read from the buffer sequentially (step e). The change point data Dn is compared with the reference bit pattern data 1, reference bit pattern data 2 and reference bit pattern data 3 (step f). When the data is not equal to any reference bit pattern data, bit data "11" is stored in the compression map table as shown in FIG. 6 (step g). In the same time, the change point data Dn is stored as compression bit pattern data in FIG. 6 (step h). When it is equal to the reference bit pattern data 1, "00" is stored in the compression map table in FIG. 6, when it is equal to the reference bit pattern data 2, bit data "01" is stored in the same and when it is equal to the reference bit pattern data 3, bit data "10" is stored in the same (step i).

"1" is subtracted from the value of the counter (step j). The above operations e–j are repeated until the value of the counter becomes "0" (step k).

Next, the data reproducing operation in the second embodiment will be explained with reference to a flow chart shown in FIG. 8.

The pattern data number "(14)H" in FIG. 6 is set in the counter (step m). The bit data is read separately sequentially from the top from the compression map table in FIG. 6 (step n). It is compared to determine if the bit data is "11" or not (step o). When the bit data is "11" the compression bit pattern data in FIG. 6 is read and is reproduced as the change point data in FIG. 2 (step p). When the bit data is not "11" the reference bit pattern data 1 (when the bit data is "00"), reference bit pattern data 2 (when the bit data is "01") or reference bit pattern data 3 (when the bit data is "10" is reproduced as the change point data in FIG. 2 (step q).

"1" is subtracted from the value of the counter (step r). The above operations n–r are repeated until the value of the counter becomes "0" (step s). Thus the first bit patterns A1–A20 in FIG. 1(A) are reproduced from the second bit patterns B1–B20 in FIG. 1(B) to reproduce the original font pattern in the same manner as in the first embodiment (step t).

Although the above description has been presented for the case in which the first bit patterns are composed as units of columns of bits in the first and second embodiment, they may be alternatively comprised of units of rows of bits.

A third embodiment of the present invention will now be explained with reference to FIGS. 9, 10, 11, 12 and 13.

Figure 9:
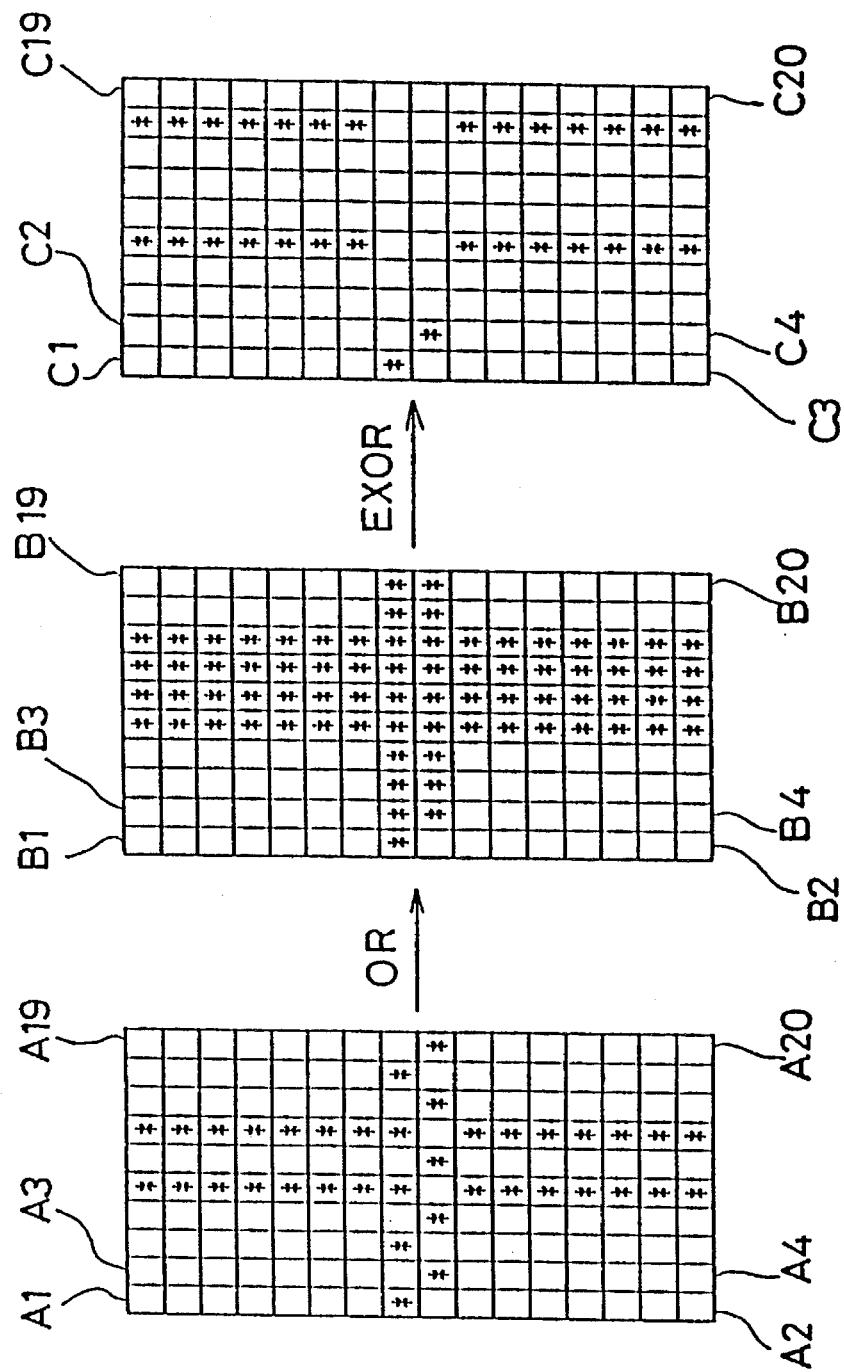
Figure 12:
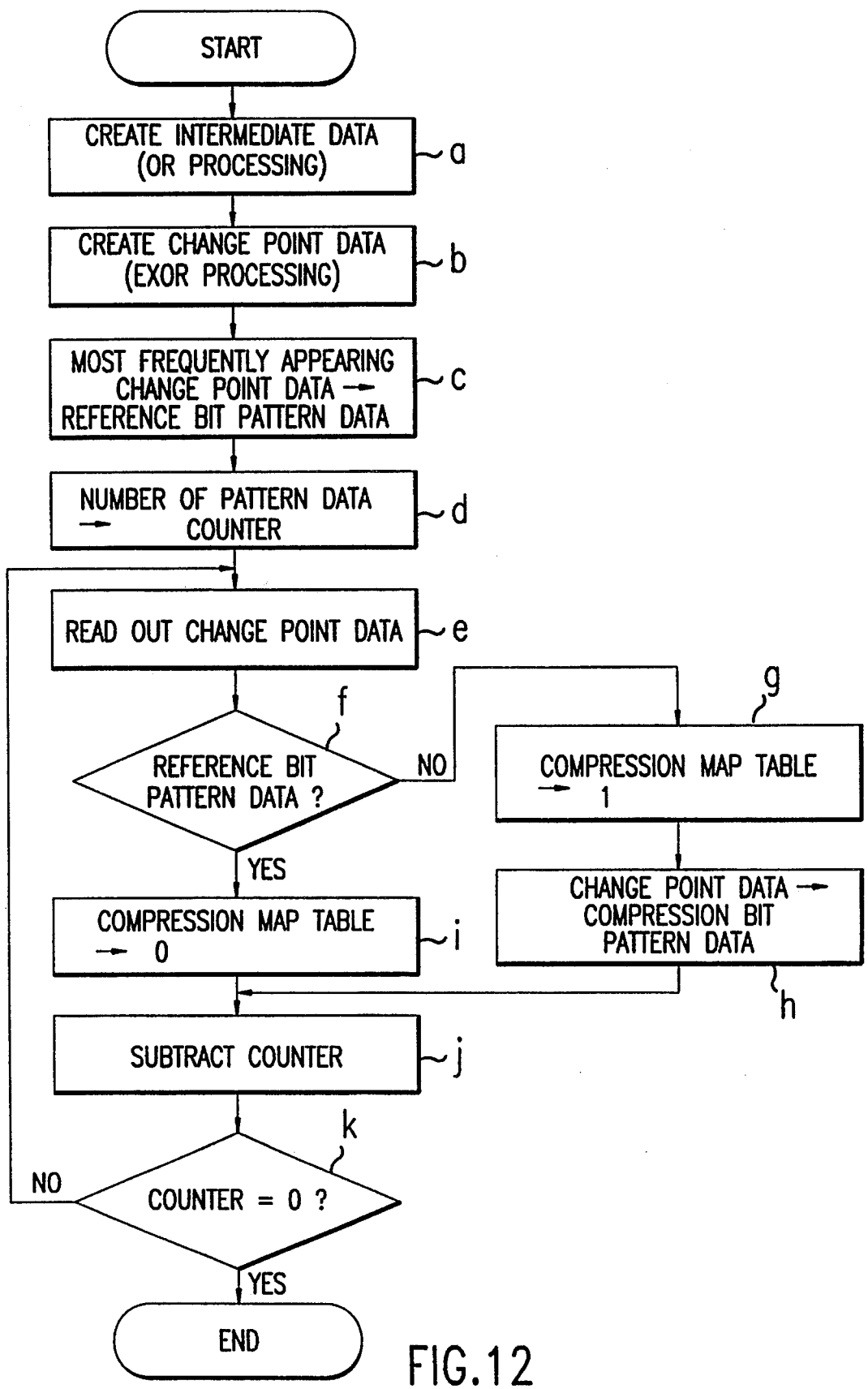
FIG. 12 is a flow chart showing a data compressing operation according to the third embodiment of the invention.
Figure 13:
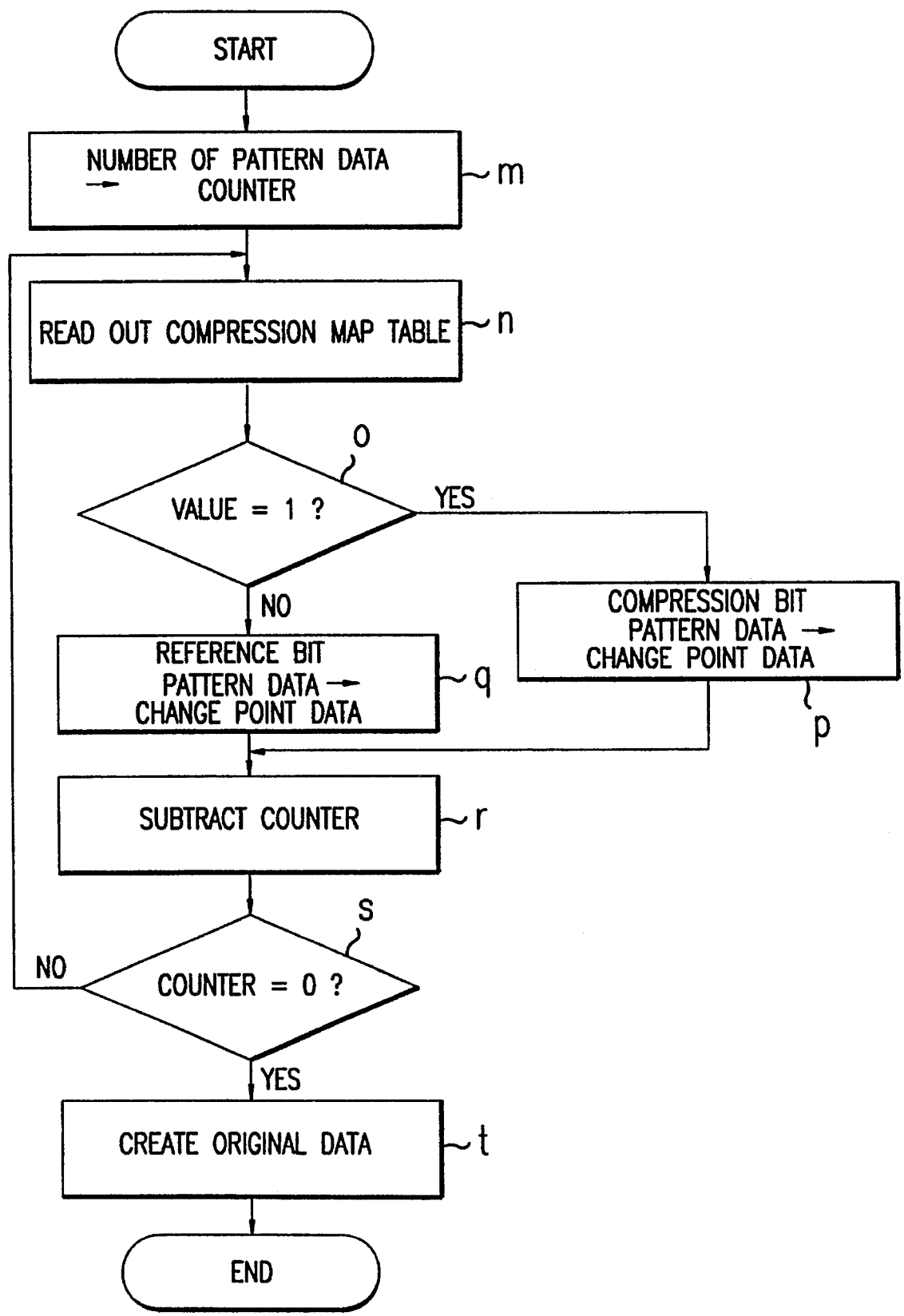
FIG. 13 is a flow chart showing a data reproducing operation according to the third embodiment of the invention.

FIG. 9(A) is an explanatory drawing showing an original font pattern, FIG. 9(B) is an explanatory drawing showing the font pattern at an intermediate stage during processing and FIG. 9 (C) is an explanatory drawing showing the font pattern after translation, FIG. 10 is an explanatory drawing showing hexadecimal data which corresponds to the font pattern after translation in FIG. 9(C), FIG. 11 is a table showing each data created and stored based on the font pattern after translation, FIG. 12 is a flow chart showing a data compressing operation, and FIG. 13 is a flow chart showing a data reproducing operation.

The data compressing operation according to the third embodiment will be explained with reference to the flow chart of FIG. 12.

FIG. 9(A) shows an original font pattern for one font and the original font pattern is divided into first bit patterns A1–A20 each of which is composed of a column of 8 bits. Second bit patterns B1–B20 are shown in FIG. 9(B) and are created by implementing logical sum (OR) processing sequentially to those first bit patterns A1–A20. Specifically, the following processing is carried out.

```
A1 . . . B1
A2 . . . B2
A1 (OR) A3 . . . B3
A2 (OR) A4 . . . B4
   .
   .
   .
A17 (OR) A19 . . . B19
A18 (OR) A20 . . . B20
```

By implementing exclusive logical sum (EXOR) processing to the second bit patterns B1–B20, third bit patterns C1–C20 shown in FIG. 9(C) are created. Specifically, the following processing is carried out.

```
B1 ... C1
B2 ... C2
B1 (EXOR) B3 ... C3
B2 (EXOR) B4 ... C4
    .
    .
    .
B17 (EXOR) B19 ... C19
B18 (EXOR) B20 ... C20
```

By representing those third bit patterns C1–C20 by hexadecimal data, change point data D1–D20 shown in FIG. 10 may be obtained. Those change point data D1–D20 are stored once in a buffer. The subscript "H" denotes hexadecimal data (step b).

Data "(FF)H" which appears most frequently among the change point data D1–D20 in FIG. 10 is stored as reference bit pattern data in FIG. 11 (step c). The number of the third bit patterns C1–C20, i.e., the number of change points data D1–D20 "(14)H" is set in a counter as a number of pattern data in FIG. 11 (step d).

The change point data D1–D20 is sequentially read from the buffer (step e). The change point data Dn read is compared with the reference bit pattern data "(00)H" (step f). When the two data are not equal, bit data "1" is stored in the compression map table in FIG. 11 (step g). At the same time, the change point data Dn is stored as compression bit pattern data (step h). When the two data are equal, bit data "0" is stored in the compression map table in FIG. 11 (step i).

"1" is subtracted from the value of the counter (step j). The above operation steps e–j are repeated until the value of the counter becomes "0" (step k). Thus while the difference and equality of the change point data Dn and the reference bit pattern data "(00)H" are stored sequentially in the compression map table, the change point data Dn is stored sequentially as a compression bit pattern data only when the two data differ.

The data reproducing operation in the third embodiment will now be explained with reference to a flow chart shown in FIG. 13.

The pattern data number "(14)H" in FIG. 11 is set in the counter (step m). The bit data is read separately sequentially from the top from the compression map table in FIG. 11 (step n). It is compared to determine if the bit data is "1" or not (step o). When the bit data is "1" the compression bit pattern data in FIG. 11 is read sequentially from the top and is reproduced as the change point data in FIG. 10 (step p). When the bit data is not "1", the reference bit pattern data "(00)H" in FIG. 11 is reproduced as the change point data in FIG. 10 (step q).

"1" is subtracted from the value of the counter (step r) The above operation steps n–r are repeated sequentially until the value of the counter becomes "0" (step s). Thus the change point data D1–D20 in FIG. 10, i.e., the third bit patterns C1–C20 in FIG. 9 are reproduced. The first bit patterns A1–A20 in FIG. 9(A) are reproduced from the third bit patterns C1–C20 in FIG. 9(C) to reproduce the original font pattern (step t).

The fourth embodiment of the invention will now be explained with reference to FIGS. 9, 10, 14, 15 and 16.

Figure 15:
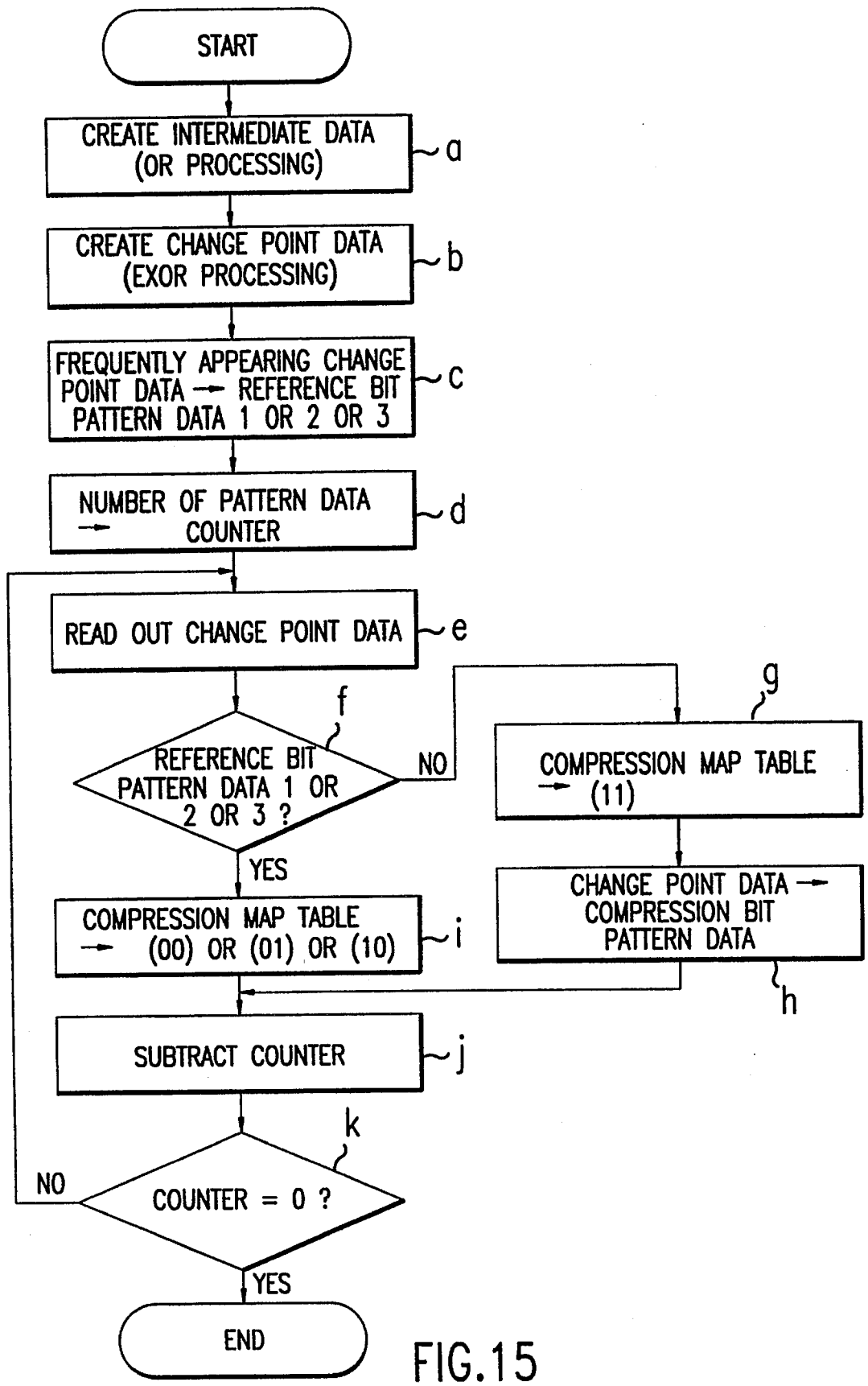
FIG. 15 is a flow chart showing a data compressing operation according to the fourth embodiment of the invention.
Figure 16:
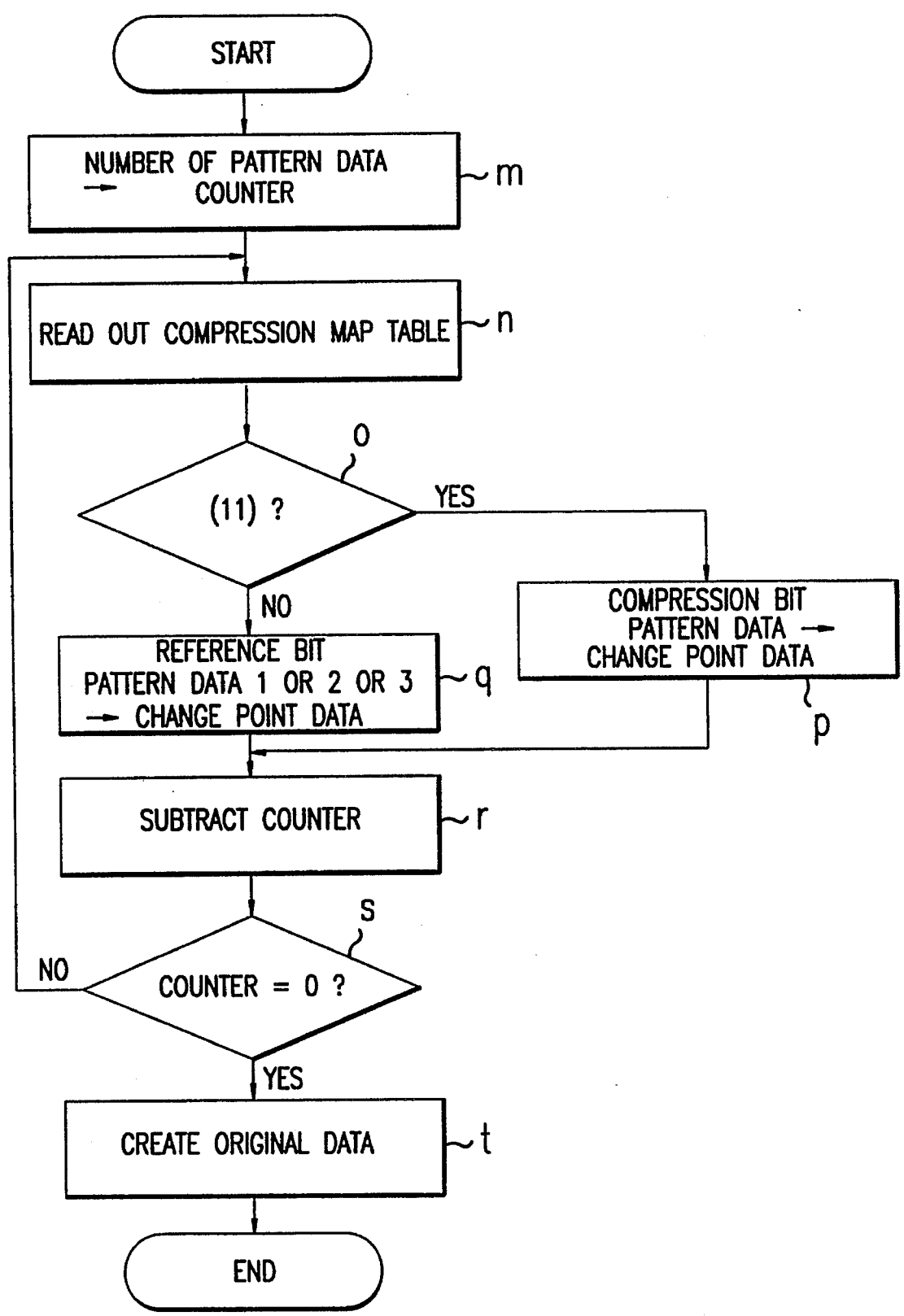
FIG. 16 is a flow chart showing a data reproducing operation according to the fourth embodiment of the invention.

FIGS. 9 and 10 are the same as those in the third embodiment and FIGS. 14, 15 and 16 correspond respectively to FIGS. 11, 12 and 13 in the third embodiment. Accordingly, the part of explanation which overlaps with that of the third embodiment will be omitted hereinafter.

The data compression operation of the fourth embodiment will be explained with reference to FIG. 15.

The second bit patterns B1–B20 in FIG. 9(B) and third bit patterns C1–C20 in FIG. 9(C) are created by implementing OR and EXOR processing on the first bit patterns A1–A20 in FIG. 9(A) in the same manner as in the third embodiment and the change point data D1–D20 in FIG. 10 are stored in the buffer (steps a, b).

Three data which appear more frequently among the change point data D1–D20 in FIG. 10, i.e., "(00)H" "(FE)H" and "(7F)H" are selected and are stored respectively as reference bit pattern data 1, reference bit pattern data 2 and reference bit pattern data 3 in FIG. 14 (step c). The number of the third bit patterns C1–C20, i.e., the number of change points data D1–D20 "(14)H" is set in a counter as a number of pattern data in FIG. 14 (step d).

The change point data D1–D20 is read from the buffer sequentially (step e). The change point data Dn read is compared with the reference bit pattern data 1, reference bit pattern data 2 and reference bit pattern data 3 (step f). When the data is not equal to any reference bit pattern data, bit data "11" is stored in the compression map table in FIG. 14 (Step g). At the same time, the change point data Dn is stored as a compression bit pattern data in FIG. 14 (step h). When it is equal to the reference bit pattern data 1, bit data "00" is stored in the compression map table in FIG. 14, when it is equal to the reference bit pattern data 2, bit data "01" is stored in the same and when it is equal to the reference bit pattern data 3, bit data "10" is stored in the same (step i).

"1" is subtracted from the value of the counter (step j). The above operation steps e–j are repeated until the value of the counter becomes "0" (step k).

The data reproducing operation of the fourth embodiment will be explained with reference to the chart of FIG. 16.

The pattern data number "(14)H" in FIG. 14 is set in the counter (step m). The bit data is read separately sequentially from the top from the compression map table in FIG. 14 (step n). It is compared to determine if the bit data is "11" or not (step o). When the bit data is "11" one of the compression bit pattern data in FIG. 14 is read sequentially from the top and is reproduced as the change point data in FIG. 10 (step p). When the bit data is not "11" the reference bit pattern data 1 (when the bit data is "00"), reference bit pattern data 2 (when the bit data is "01") or reference bit pattern data 3 (when the bit data is "10") is reproduced as the change point data in FIG. 10 (step q).

"1" is subtracted from the value of the counter (step r). The above operation steps n–r are repeated until the value of the counter becomes "0" (step s). Thus the first bit patterns A1–A20 in FIG. 9(A) are reproduced from the third bit patterns C1–C20 in FIG. 9 (C) to reproduce the original font pattern in the same manner as in the third embodiment (step t).

Although the description has been presented for the case in which the first bit patterns are formed as units of columns of bits in the third and fourth embodiment, they may be formed as units of rows of bits.

Accordingly, the present invention permits the effective compression of a font pattern.

Although the present invention has been fully described by way of example with reference to the accompanying drawings, it is to be understood that various changes and modifications will be apparent to those skilled in the art. Therefore, unless such changes or modifications depart from the scope of the invention, they should be construed as being included therein.

What we claim is:

1. A method for generating font data, comprising the steps of:

dividing a font pattern represented by a matrix to form a plurality of first bit patterns each of which is comprised of at least a part of a row or column of said matrix, each of said first bit patterns having neighboring bit patterns;

sequentially forming exclusive logical sums of said first bit patterns and said bit patterns neighboring said first bit patterns to form a plurality of second bit patterns;

designating at least one bit pattern which appears frequently in said plurality of said second bit patterns as a reference bit pattern; and comparing each of said second bit patterns with said reference bit pattern to identify differences between said second bit patterns and said reference bit pattern, and storing only said identified differences in a memory, whereby said stored differences corresponding to only said identified differences comprise said font data.

2. The method of claim 1 wherein said step of designating a reference bit pattern comprises the step of designating the bit pattern of said second bit pattern that appears more frequently than any other bit pattern as said reference bit pattern.

3. The method of claim 1 wherein said step of designating at least one bit pattern comprises the step of designating a plurality of bit patterns which appear most frequently in said plurality of second bit patterns as reference bit patterns, and said step of comparing comprises the step of comparing each of said second bit patterns with each of said reference bit patterns to identify differences and storing said differences in said memory.

4. A method for creating font data comprising the steps of:

dividing a font pattern represented by a matrix to form a plurality of first bit patterns each of which is comprised of at least a part of a row or column of said matrix, each of said first bit patterns having neighboring bit patterns;

sequentially forming logical sums of neighboring ones of said first bit patterns to form a plurality of second bit patterns;

sequentially forming exclusive logical sums from neighboring ones of said second bit patterns to form a plurality of third bit patterns;

designating at least one bit pattern which appears frequently in said plurality of said third bit patterns as a reference bit pattern; and comparing each said bit pattern of said plurality of third bit patterns and said reference bit pattern to identify bit patterns that are different from said reference bit pattern, and storing only said bit patterns that are different in a memory, whereby said stored bit patterns comprise said font data.

5. The method of claim 4 wherein said step of designating comprises the step of designating the bit pattern of said third bit patterns that occurs more frequently than any other bit pattern therein as said reference bit pattern.

6. The method of claim 4 wherein said step of designating comprises the step of designating a plurality of bit patterns of said third bit patterns that appear most frequently as reference bit patterns.

* * * * *